United States Patent [19]

Arita et al.

[11] Patent Number: 4,626,707

[45] Date of Patent: Dec. 2, 1986

[54] SIGNAL SELECTION CIRCUIT

[75] Inventors: Setsuo Arita; Fumiyasu Ohkido, both of Hitachi, Japan

[73] Assignee: Hitachi, Ltd., Tokyo, Japan

[21] Appl. No.: 617,097

[22] Filed: Jun. 4, 1984

[30] Foreign Application Priority Data

Jun. 3, 1983 [JP] Japan ................................ 58-97854

[51] Int. Cl.[4] ............................................. H03K 5/24
[52] U.S. Cl. .................... 307/355; 307/219; 307/357; 307/359; 307/441
[58] Field of Search ............... 307/441, 219, 355, 356, 307/357, 359, 350

[56] References Cited

U.S. PATENT DOCUMENTS 3,596,107  7/1971  Kittrell ............................... 307/357
3,858,199  12/1974  Neuner et al. ....................... 307/357
3,969,619  7/1976  El-Ramly ............................ 307/357

Primary Examiner—John Zazworsky
Attorney, Agent, or Firm—Antonelli, Terry & Wands

[57] ABSTRACT

A signal selection circuit, for example, a high value selection circuit, has two unit circuit elements each including of an amplifier with an inverted input terminal and a non-inverted input terminal, and a transistor of which the base is connected to the output terminal of the amplifier and of which the emitter is connected to the inverted input terminal of the amplifier. Input signals are applied to the non-inverted input terminal of the amplifier. A constant-current circuit is connected to the emitter of npn-type transistor in each of the unit circuit elements, and is further connected to a first power-source terminal. A second power-source terminal is connected to the collector of each of the transistors.

8 Claims, 9 Drawing Figures

SIGNAL SELECTION CIRCUIT

BACKGROUND OF THE INVENTION

The present invention relates to a signal selection circuit for selecting signals of predetermined levels out of a plurality of input signals. More specifically, the invention relates to a signal selection circuit which can be suitably employed for a high value selection circuit that selects signals of the highest level, which can be employed for a low value selection circuit that selects signals of the lowest level, and which can also be employed for a middle value selection circuit that selects signals of the middle level.

Control device employed in power plants (such as thermal power plants and nuclear power plants) and in chemical plants, create extensive adverse effects once they become defective. Therefore, very high reliability is required for such devices.

A doubled or tripled redundancy control device has heretofore been used significantly in such plants. The redundancy control device selects signals of the highest level, signals of the lowest level or signals of the middle level out of the signals (analog signals) produced by two or three sensors that detect the same state quantity depending upon the plants, and sends the selected signals to an actuator which directly controls an object that is to be controlled.

A low value selection circuit and a high value selection circuit have been disclosed in Japanese Patent Laid-Open No. 64251/1977, and middle value selection circuits have been disclosed in Japanese Patent Laid-Open No. 11638/1975 and in Japanese Utility Model Laid-Open No. 117001/1980. A middle value selection circuit has also been disclosed in U.S. Ser. No. 512,000 entitled "Middle Value Selection Circuit".

SUMMARY OF THE INVENTION

The object of the present invention is to provide a signal selection circuit which is capable of selecting signals highly accurately, and which is capable of greatly reducing errors in the selected signals.

Another object of the present invention is to provide a signal selection circuit which does not permit error in the output signals to change irrespective of the change in the level of input signals.

The feature of the present invention resides in that provision is made of a plurality of unit circuit elements each of which consists of an amplifier having an inverted input terminal and a non-inverted input terminal, and a transistor of which the base is connected to the output terminal of the amplifier. The emitter transistor is connected to the inverted input terminal of the amplifier, and a constant-current circuit connected to a first power-source terminal also connected to the emitter of the transistor in each of the unit circuit elements. These emitters are also connected to an output terminal, and the collector of the transistor in each of the unit circuit elements is connected to a second power-source terminal.

DESCRIPTION OF THE PREFERRED EMBODIMENTS

The present invention was accomplished through studying causes of errors in the signals produced by the conventional high value selection circuits. Results of the study are mentioned below.

Figure 1:
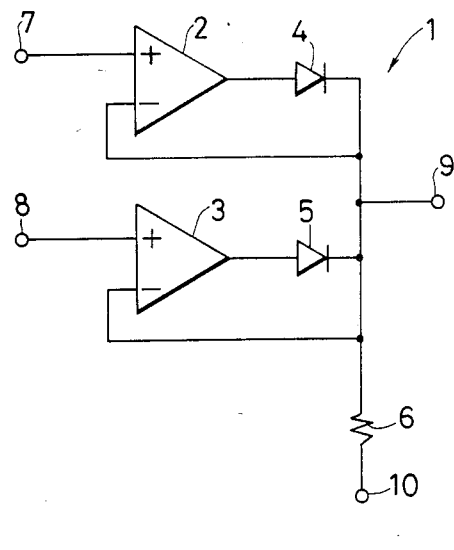
FIG. 1 is a system diagram of a conventional high value selection circuit.

FIG. 1 shows a high value selection circuit disclosed in Japanese Patent Laid-Open No. 64251/1977. The high value selection circuit 1 consists of amplifiers 2 and 3, diodes 4 and 5, and a resistor 6. An input terminal 7 is connected to a positive terminal of the amplifier 2, and an input terminal 8 is connected to a positive terminal of the amplifier 3. Reference numeral 9 denotes an output terminal, and 10 denotes a power-source terminal. A circuit consisting of amplifier 2 and diode 4, and a circuit consisting of amplifier 3 and diode 5, constitute an ideal diode. In the high value selection circuit 1, output sides of the two ideal diodes are connected together, a resistor 6 is connected between the point of above connection and the power-source terminal 10, and a point to which outputs of the ideal diodes are connected together is connected to the output terminal. Output signal of the high value selection circuit 1 is taken out from the output terminal 9.

The thus constructed high value selection circuit 1 receives input signals of voltages $E_1$, $E_2$ through the input terminals 7 and 8. When these signals maintain a relation $E_1 > E_2$, the ideal diode consisting of amplifier 2 and diode 4 is rendered conductive, the ideal diode consisting of amplifier 3 and diode 5 is rendered nonconductive, and a signal $E_1$ of high value is obtained from the output terminal 9.

Here, if the power-source voltage at the power-source terminal 10 is denoted by $E_s$, the voltage of output signal at the output terminal 9 by $E_{out}$, and the resistance of the resistor 6 by R, an electric current I (amperes) which flows into the resistor 6 is given by the following equation (1), $$I = (E_s - E_{out})/R \qquad (1)$$

Figure 2:
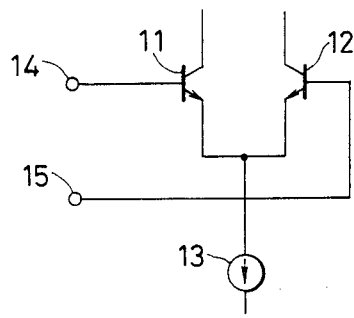
FIG. 2 is a system diagram showing in detail an input portion of an amplifier illustrated in FIG. 1.

As will be obvious from the equation (1), the electric current I changes depending upon the intensity of output signal voltage $E_{out}$, since the output signal voltage $E_{out}$ changes depending upon the input signal voltages $E_1$ and $E_2$. In other words, the electric current I flowing into the resistor 6 changes depending upon the intensities of signals input to the terminals 7 and 8. The input side of the amplifiers 2 and 3 usually forms a differential amplifier circuit as shown in FIG. 2, where reference numerals 14 and 15 denote input terminals, 11 and 12 denote npn-type transistors, and 13 denotes a constant-current circuit. The input terminal 14 serves as positive terminals of the amplifiers 2 and 3, and the input terminal 15 serves as negative terminals of the amplifiers 2 and 3. Therefore, the electric current I flowing into the resistor 6 of FIG. 1 also flows into the base of the npn-type transistor 11 or 12 shown in FIG. 2. Since the current I flowing into the resistor 6 changes depending upon the voltages of signals input to the terminals 7 and 8, as described above, the base current flowing into the npn-type transistor 11 or 12 is subject to change. Then, a base-emitter voltage $V_{BE}$ of the npn-type transistor 11 or 12 changes correspondingly; i.e., the change in the voltage $V_{BE}$ turns out to be error in the signals produced from the output terminal 9.

That is, it was found that in the high value selection circuit of FIG. 1, error in the output changes depending upon the intensity of input voltage.

A low value selection circuit can be realized by connecting the diodes 4 and 5 of FIG. 1 in the opposite directions. In this case, however, there remains the same problem as that of the high value selection circuit 1.

A middle value selection circuit can be constituted by combining three high value selection circuits and one low value selection circuit. Namely, the high value selection circuit 1 and the low value selection circuit should be employed as the high value selection circuit and as the low value selection circuit. Even in this case, however, error in the output signals changes depending upon the voltages of input signals, making it difficult to select the signals highly accurately.

The inventors have conducted extensive study in an attempt to reduce errors in the signals produced by the signal selection circuits, and have found the fact that errors can be reduced in the signals produced by the signal selection circuits by using transistors in place of diodes employed in the conventional ideal diodes.

The invention accomplished through the above-mentioned study will be described below in detail with reference to embodiments.

Figure 3:
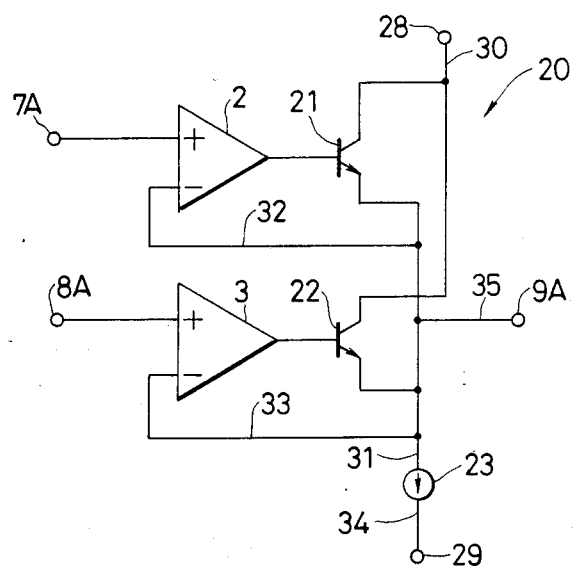
FIG. 3 is a system diagram of a high value selection circuit according to a preferred embodiment of the present invention.

FIG. 3 shows a high value selection circuit 20 according to a preferred embodiment of the present invention, which consists of amplifiers 2 and 3, npn-type transistors 21 and 22, and a constant-current circuit 23. The input sides of the amplifiers 2 and 3 have the circuit setup as shown in FIG. 2.

An input terminal 7A is connected to a positive terminal (non-inverted input terminal) of the amplifier 2, and an input terminal 8A is connected to a positive terminal (non-inverted terminal) of the amplifier 3. The output terminal of the amplifier 2 is connected to the base of the npn-type transistor 21. The output terminal of the amplifier 3 is connected to the base of the npn-type transistor 22. Collectors of the npn-type transistors 21, 22 are connected to a terminal 28 via a wiring 30. The terminal 28 is connected to a power source of the positive polarity. A wiring 31 connected to the emitters of the npn-type transistors 21 and 22 is coupled to the constant-current circuit 23. A wiring 34 connects the constant-current circuit 23 to a terminal 29 which is connected to the power source of the negative polarity. A wiring 32 connected to the emitter of the npn-type transistor 21 is connected to the negative terminal (inverted input terminal) of the amplifier 2, and a wiring 33 connected to the emitter of the npn-type transistor 22 is connected to the negative terminal (inverted input terminal) of the amplifier 3. An output terminal 9A is connected via a wiring 35 to a point where the emitter of npn-type transistor 21 and the emitter of npn-type transistor 22 are connected together. Namely, the output terminal 9A is connected to a middle point of the wiring 31.

Figure 4:
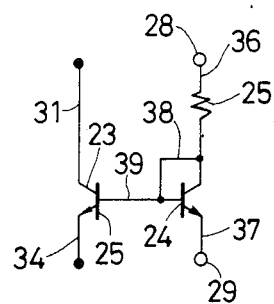
FIG. 4 is a system diagram of a constant-current circuit shown in FIG. 3.

FIG. 4 shows a constant-current circuit which is generally referred to as a current mirror-type constant-current circuit. The constant-current circuit 23 consists of an npn-type transistor 25. The wiring 31 is connected to the collector of npn-type transistor 25 and the wiring 34 is connected to the emitter of npn-type transistor 25. The base of npn-type transistor 25 is connected to the base of npn-type transistor 24 via a wiring 39. A wiring 36 having resistor 25 connects the terminal 28 to the collector of npn-type transistor 24. The emitter of npn-type transistor 24 is connected to the terminal 29 via a wiring 37. A wiring 38 connects the collector of npn-type transistor 24 to the base thereof.

In this embodiment, output terminals of the amplifiers 2 and 3 are connected to the constant-current circuit 23 via respective diodes formed by the base and emitter of the npn-type transistors 21, 22, such that a signal having a higher level is selected between the signals input to the terminals 7A and 8A. Here, an input signal having a voltage $E_1$ may be applied to the input terminal 7A, and an input signal having a voltage $E_2$ may be input to the input terminal 8A. It is supposed that the voltages of these input signals have a relation $E_1 > E_2$. In this case, the npn-type transistor 21 operates, and the npn-type transistor 22 is rendered nonconductive. The output current of the constant-current circuit 23 serves as an emitter current for the npn-type transistor 21. Since the emitter of the npn-type transistor 21 has been fed back to the amplifier 2, the signal (voltage $E_1$) input to the input terminal 7A is produced from the output terminal 9A.

When the input signals input to the terminals 7A and 8A have a relation $E_1 < E_2$, the npn-type transistor 21 is rendered nonconductive, and the npn-type transistor 22 is operated. The output current of the constant-current circuit 23 serves as an emitter current for the npn-type transistor 22. Here, since the emitter of the npn-type transistor 23 has been fed back to the amplifier 3, the signal (voltage $E_2$) input to the input terminal 8A is produced from the output terminal 9A.

Further, when the signals input to the terminals 7A and 8A have the same level, i.e., $E_1 = E_2$ (or denoted by E), both the npn-type transistors 21 and 22 are rendered operative, and the output current of the constant-current circuit 23 serves as an emitter current for both the npn-type transistors 21 and 22. Since the emitters of the transistors 21 and 22 have been fed back to the amplifiers 2 and 3, respectively, a signal having voltage E is produced from the output terminal 9A. As described above, the high value selection circuit 20 of this embodiment selects signals of the higher level at all times.

According to the high value selection circuit 20 of this embodiment as mentioned above, the constant-current circuit 23 which produces a constant current $I_O$ is connected to a point where the emitters of the npn-type transistors 21 and 22 are connected together. Therefore, a high value signal produced at the terminal 9A depending upon the input signals does not affect the base current of the npn-type transistors 11, 12 in the input stage of the amplifier of FIG. 2. Accordingly, the amplifiers 2 and 3 operate stably without affected by the intensity of input signals.

Further, since the current amplification factor $\beta$ ($>$1) by the npn-type transistors 21 and 22 has a large value (about 100), the base current of the npn-type transistors 21 and 22 is given by (collector current of each transistor)/$\beta$. Therefore, the output currents of the amplifiers 2 and 3 are very small. Accordingly, errors contained in the signals input to the amplifiers 2 and 3 become very small in the outputs of the amplifiers 2 and 3.

Owing to the function of the constant-current circuit 23 and the function of the npn-type transistors 21 and 22, the high value selection circuit 20 of this embodiment selects higher value signals maintaining very high accuracy. Namely, output error of the high value selection circuit 20 is about 0.08 mV which is 1/750 of the value of the conventional circuits.

Figure 5:
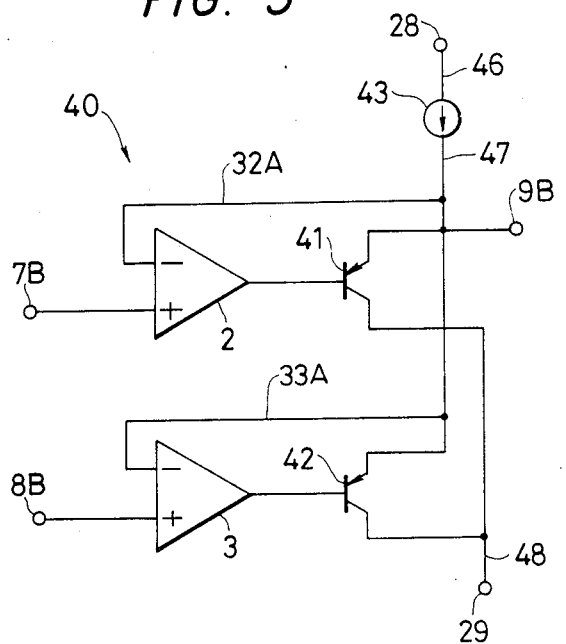
FIG. 5 is a system diagram of a low value selection circuit according to another embodiment of the present invention.

FIG. 5 shows a low value selection circuit according to another embodiment of the present invention. The low value selection circuit 40 has amplifiers 2 and 3, pnp-type transistors 41 and 42, and a constant-current circuit 43. The low value selection circuit 40 is substantially the same as the high value selection circuit 20, but in which the npn-type transistors are replaced by the pnp-type transistors. Namely, the base of pnp-type transistor 41 is connected to the output terminal of the amplifier 2, and the base of pnp-type transistor 42 is connected to the output terminal of the amplifier 3. The collectors of the pnp-type transistors 41 and 42 are connected to the terminal 29 via a wiring 48. The terminal 28 is connected to the constant-current circuit 43 via a wiring 46. The constant-current circuit 43 is connected to the emitters of pnp-type transistors 41 and 42 via a wiring 47. The emitter of pnp-type transistor 41 is connected to the negative terminal of the amplifier 2 via a wiring 32A. Further, the emitter of pnp-type transistor 42 is connected to the negative terminal of the amplifier 3 via a wiring 33A. The output terminal 9B is connected to a point where the pnp-type transistors 41 and 42 are connected together, i.e., connected to the wiring 47.

Figure 6:
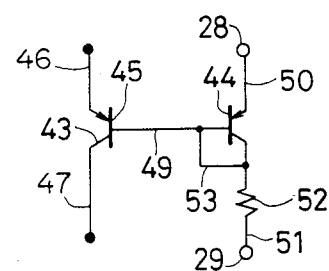
FIG. 6 is a system diagram of a constant-current circuit shown in FIG. 5.

FIG. 6 shows an example of the constant-current circuit 43 employed in this embodiment. The constant-current circuit shown in FIG. 6 is of the current mirror-type, consisting of a pnp-type transistor 43. The wiring 47 is connected to the collector of pnp-type transistor 43, and the wiring 46 is connected to the emitter of pnp-type transistor 43. The base of pnp-type transistor 43 is connected to the base of pnp-type transistor 44 via a wiring 49. The terminal 28 is connected to the emitter of pnp-type transistor 44 via a wiring 50. A wiring 51 having resistor 52 connects the terminal 29 to the collector of pnp-type transistor 44. A wiring 53 connects the base of pnp-type transistor 44 to the collector thereof.

An input signal having voltage $E_1$ is input to the input terminal 7B, and an input signal having voltage $E_2$ is input to the input terminal 8B. Here, the voltages $E_1$ and $E_2$ may have a relation $E_1 > E_2$. In this case, the pnp-type transistor 42 is rendered operative, and the output current of the constant-current circuit 43 serves as an emitter current for the pnp-type transistor 42. Here, since the emitter of the pnp-type transistor 42 has been fed back to the amplifier 3, the signal (voltage $E_2$) applied to the input terminal 8B is produced from the output terminal 9B.

Next, when the voltages of signals input to the terminals 7B and 8B have a relation $E_1 < E_2$, the pnp-type transistor 42 is rendered nonconductive, and the pnp-type transistor 41 is rendered operative. Therefore, the output current of the constant-current circuit 43 serves as an emitter current for the pnp-type transistor 41. Here, since the emitter of the pnp-type transistor 41 has been fed back to the amplifier 2, the signal (voltage $E_1$) input to the terminal 7B is produced from the output terminal 9B.

Further, when the signals input to the terminals 7B and 8B have the same level, i.e., $E_1 = E_2$ (or denoted by E), the pnp-type transistors 41 and 42 are rendered operative like the case of the high value selection circuit 20, and a signal having the voltage E is produced from the output terminal 9B.

As mentioned above, the low value selection circuit 40 of this embodiment selects the lower value signals maintaining very high accuracy owing to the functions of the transistors and constant-current circuit like the high value selection circuit 20.

A middle value selection circuit according to a further embodiment of the present invention will be described below in conjunction with FIGS. 7 and 8.

Figure 7:
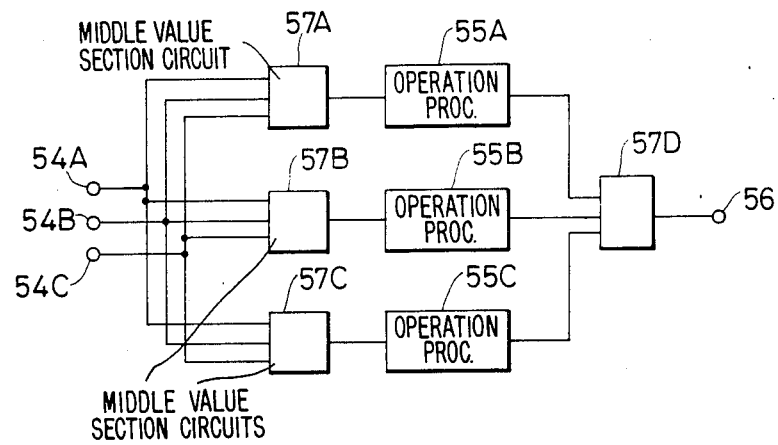
FIG. 7 is a system diagram of a tripled control device.

FIG. 7 shows a tripled control device. In a nuclear power plant, an important control system is provided with three sensors 54A, 54B and 54C to detect the same state quantity, and the equipment is controlled based upon the detection signals (analog signals) from these sensors. Signals produced by these sensors are input to three middle value selection circuits 57A, 57B and 57C that are arranged in parallel. The middle value selection circuits 57A, 57B and 57C select signals having middle values out of the signals produced from the sensors. The output signals selected by the middle value selection circuits are input to operation processors (controllers) 55A, 55B and 55C which perform arithmetic operation, comparison and judgement based upon the input signals to produce control signals for controlling equipment that is to be controlled. The control signals produced from the controllers are sent to a middle value selection circuit 57D which selects a signal having a middle value out of these control signals and sends it to an actuator 56 of equipment that is to be controlled. The actuator 56 controls equipment that is to be controlled based upon a control signal having the middle value. Even in case an abnormal signal is produced from one of these three circuits consisting of sensors 54A, 54B, 54C, middle value selection circuits 57A, 57B, 57C, and controllers 55A, 55B, 55C, the tripled control device controls equipment based upon an output signal which is always closest to a true value.

Figure 8:
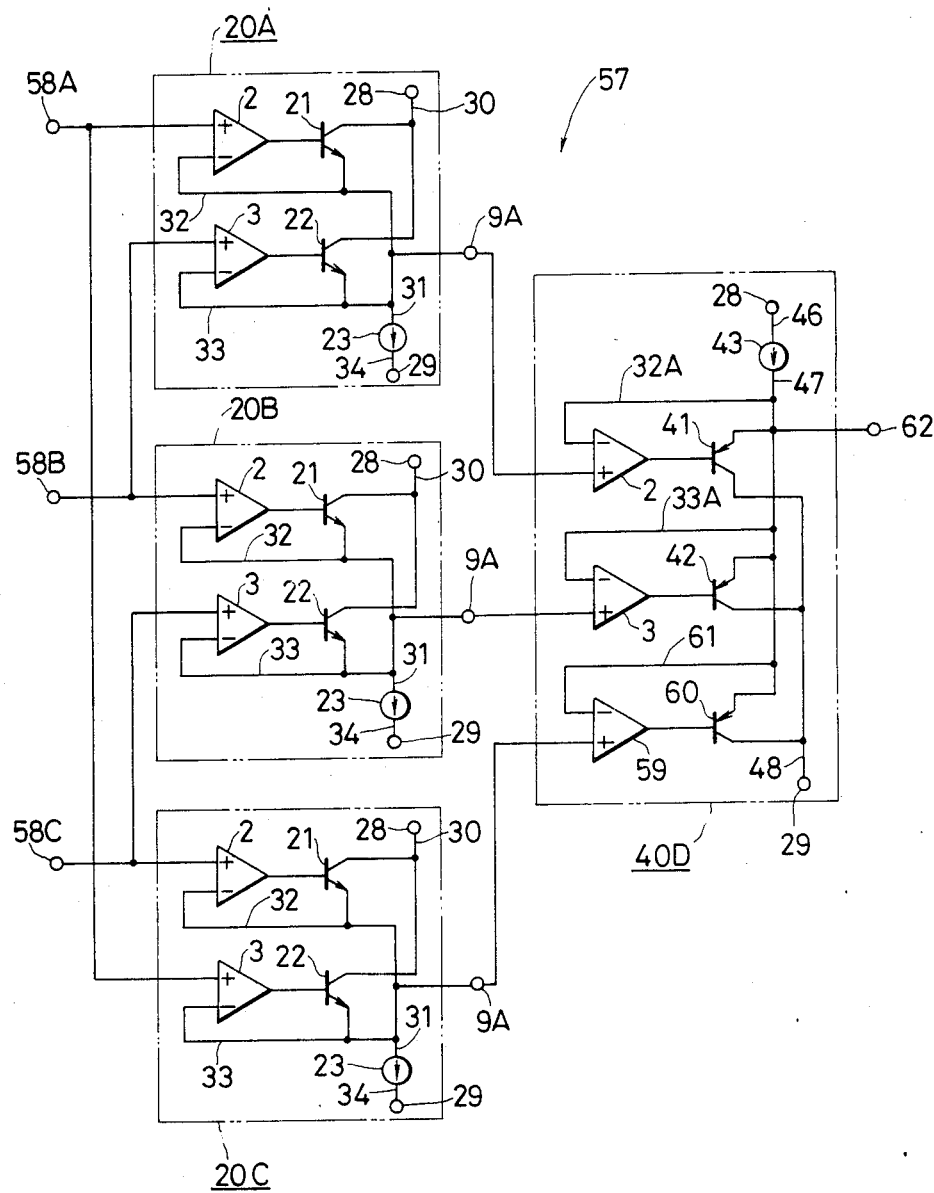
FIGS. 8 and 9 are system diagrams of middle value selection circuits according to further embodiments of the present invention, which can be used for the control device of FIG. 7.

FIG. 8 shows a detailed embodiment of the middle value selection circuits 57A to 57D. The middle value selection circuit 57 consists of three high value selection circuits 20A, 20B and 20C of the same construction as that of FIG. 3, and a low value selection circuit 40D which is based upon the principle shown in FIG. 5. The npn-type transistors used for the high value selection circuits in the middle value selection circuit 20A, 20B and 20C 57 have a conductivity type different from that of the pnp-type transistors used for the low value selection circuit 40D. Namely, in the npn-type transistors, the collectors have n-type conductivity, the bases have p-type conductivity and the emitters have n-type conductivity. In the pnp-type transistors, on the other hand, the collectors have p-type conductivity, the bases have n-type conductivity, and the emitters have p-type conductivity.

The input terminal 58A is connected to the positive terminal of the amplifier 2 of the high value selection circuit 20A and to the positive terminal of the amplifier 3 of the high value selection circuit 20C. The input terminal 58B is connected to the positive terminal of the amplifier 2 in the high value selection circuit 20B and to the positive terminal of the amplifier 3 in the high value selection circuit 20A. Further, the input terminal 58C is connected to the positive terminal of the amplifier 2 in the high value selection circuit 20C and to the positive terminal of the amplifier 3 in the high value selection circuit 20B. The high value selection circuits 20A, 20B and 20C have the same construction as that of FIG. 3, and are not described here.

The low value selection circuit 40D consists of the low value selection circuit 40 shown in FIG. 5 being further combined with a circuit consisting of an amplifier 59, a pnp-type transistor 60 and a wiring 61. The output terminal of the amplifier 59 is connected to the base of pnp-type transistor 60. The emitter of pnp-type transistor 60 is connected via wiring 61 to the negative terminal of the amplifier 59. The emitter of pnp-type transistor 60 is connected to a wiring 47 and the collector thereof is connected to a wiring 48, respectively. The output terminal 62 is connected to a point where the emitters of pnp-type transistors 41, 42 and 60 are connected together, i.e., connected to the wiring 47.

The output terminal 9A of the high value selection circuit 20A is connected to the positive terminal of the amplifier 2 in the low value selection circuit 40D. The output terminal 9A of the high value selection circuit 20B is connected to the positive terminal of the amplifier 3 in the low value selection circuit 40D. The output terminal 9A of the high value selection circuit 20C is connected to the positive terminal of the amplifier 59 in the low value selection circuit 40D.

A signal of the voltage $E_1$ is input to the input terminal 58A, a signal of the voltage $E_2$ is input to the input terminal 58B, and a signal of the voltage $E_3$ is input to the input terminal 58C. It is presumed that a relation $E_1 > E_2 > E_3$ exists among these voltages. The high value selection circuit 20A which receives two signals having voltage $E_1$ and $E_2$ selects and produces the signal having the voltage $E_1$. The high value selection circuit 20B receives two signals having voltages $E_2$ and $E_3$, and selects and produces the signal having the voltage $E_2$. The high value selection circuit 20 C selects and produces the signal having the voltage $E_1$ between the two input signals having voltages $E_1$ and $E_3$.

The low value selection circuit 40D selects a signal having the lowest value just like the low value selection circuit 40. In the low value selection circuit 40D, the amplifier 2 receives the signal having voltage $E_1$, the amplifier 3 receives the signal having voltage $E_2$, and the amplifier 59 receives the signal having voltage $E_1$. Therefore, the low value selection circuit 40D selects the signal having the lowest voltage $E_2$ out of these three input signals, and produces it from the output terminal 62. Namely, the middle value selection circuit 57 selects the signal having voltage $E_2$ of the middle level out of the signals input to the terminals 58A to 58C, and produces it.

The middle value selection circuit 57 of this embodiment has the functions of the highly accurate high value selection circuit and low value selection circuit shown in FIGS. 3 and 5, and can hence select a signal having the middle value maintaining very high accuracy.

Figure 9:
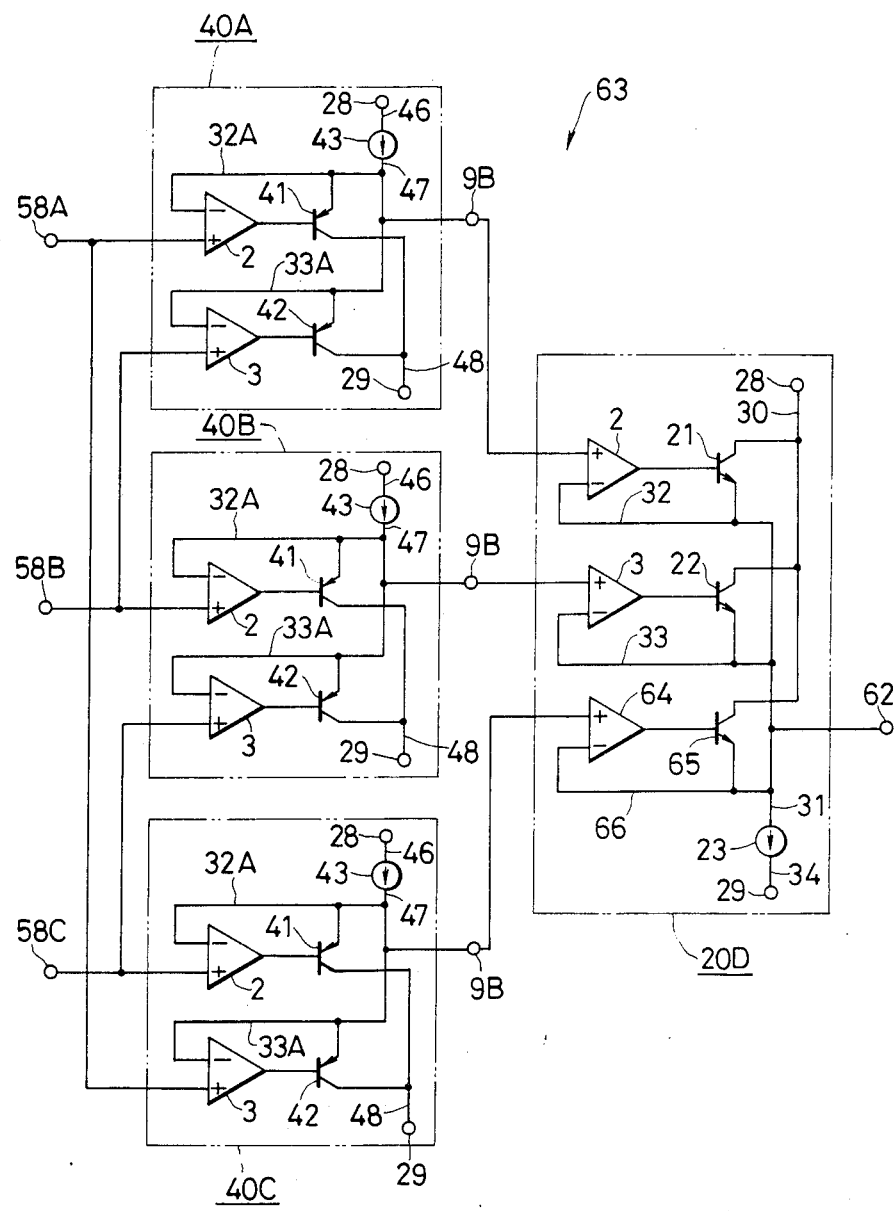

FIG. 9 shows the middle value selection circuit 63 according to a further embodiment. Contrary to the aforementioned middle value selection circuit 57, the middle value selection circuit 63 has low value selection circuits in the former stage and has a high value selection circuit in the latter stage. The low value selection circuits 40A, 40B and 40C disposed in the former stage have the same construction as the low value selection circuit 40 shown in FIG. 5. The high value selection circuit 20D disposed in the latter stage consists of the high value selection circuit 20 of FIG. 3 being further combined with an amplifier 64, an npn-type transistor 65 and a wiring 66. The pnp-type transistors employed for the low value selection circuits in the middle value selection circuit 63 have the conductivity type different from that of the npn-type transistors employed for the high value selection circuit. The base of npn-type transistor 65 is connected to the output terminal of the amplifier 64. A wiring 66 connects the negative terminal of the amplifier 64 to the emitter of the npn-type transistor 65. The collector of npn-type transistor 65 is connected to the wiring 30, and the emitter thereof is connected to the wiring 31. The output terminal 62 is connected to the wiring 31.

The input terminal 58A is connected to the positive terminal of the amplifier 2 in the low value selection circuit 40A and to the positive terminal of the amplifier 3 in the low value selection circuit 40C. The input terminal 58B is connected to the positive terminal of the amplifier 2 in the low value selection circuit 40B and to the positive terminal of the amplifier 3 in the low value selection circuit 40A. The positive terminal of the amplifier 2 in the low value selection circuit 40C and the positive terminal of the amplifier 3 in the low value selection circuit 40B are coupled to the input terminal 58C. The output terminal 9B of the low value selection circuit 40A is connected to the positive terminal of the amplifier 2 in the high value selection circuit 20D. The positive terminal of the amplifier 3 in the high value selection circuit 20D is connected to the output terminal 9B of the low value selection circuit 40B. The positive terminal of the amplifier 64 in the high value selection circuit 20D is connected to the output terminal 9B of the low value selection circuit 40C.

A signal of voltage $E_1$ is input to the input terminal 58A, a signal of voltage $E_2$ is input to the input terminal 58B, and a signal of voltage $E_3$ is input to the input terminal 58C, respectively. It is presumed that these voltages have a relation $E_1 > E_2 > E_3$. The low value selection circuit 40A selects the signal of voltage $E_2$ between the two input signals having voltages $E_1$ and $E_2$, and produces it. The low value selection circuit 40B receives two signals having voltages $E_2$ and $E_3$, and selects the signal of voltage $E_3$ which is a lower value. The low value selection circuit 40C which has received two signals having voltages $E_1$ and $E_2$, selects the signal of voltage $E_3$ which is a lower value.

Like the high value selection circuit 20, the high value selection circuit 20D selects a signal having the highest level among the input signals. The high value selection circuit 20D receives three signals, i.e., receives a signal of voltage $E_2$ produced by the low value selection circuit 40A, a signal of voltage $E_3$ produced by the low value selection circuit 40B, and a signal of voltage $E_3$ produced by the low value selection circuit 40C. The high value selection circuit 20D selects a signal of voltage $E_2$ which is the highest level among these three signals.

As described above, the middle value selection circuit 63 selects a signal of voltage $E_2$ which is the middle level among the signals input to the terminals 58A to 58C, and produces it from the output terminal 62.

Like the middle value selection circuit 57 mentioned earlier, the middle value selection circuit 63 of this embodiment permits error to change very little and renders the value of error to be minimized. Therefore, the middle value selection circuit 63 can select a signal having the middle value maintaining very high accuracy.

According to the present invention as described in the foregoing, signals having a predetermined level can be selected out of a plurality of input signals highly accurately with very reduced error.

What is claimed is:

1. A signal selection circuit having a plurality of unit circuit elements each of which is comprised of an amplifier having an inverted input terminal and a non-inverted input terminal, and a transistor of which the base is connected to the output terminal of said amplifier and of which the emitter is connected to the inverted input terminal of said amplifier, wherein a constant-current circuit connected to a first power-source terminal is connected to the emitter of said transistor in each of said unit circuit elements, these emitters are connected to an output terminal, and the collector of said transistor in each of said unit circuit elements is connected to a second power-source terminal.

2. A signal selection circuit according to claim 1, wherein said transistors are npn-type transistors.

3. A signal selection circuit according to claim 1, wherein said transistors are pnp-type transistors.

4. A signal selection circuit according to claim 1, wherein said constant-current circuit is a current mirror-type constant-current circuit.

5. A signal selection circuit comprising three first selection means each receiving two input signals selected from among three input signals, said two input signals to each of said three first selection means being selected in different combinations, and each selecting and producing one signal out of said different combinations of two input signals, and a second selection means which receives signals produced by each of said first selection means; wherein, each of said first selection means has a pair of first unit circuit elements each comprised of an amplifier with an inverted input terminal and a non-inverted input terminal to receive one of said input signals, and a first transistor of which the base is connected to the output terminal of said first amplifier and of which the emitter is connected to said inverted terminal of said first amplifier, wherein a first constant-current circuit connected to a first power-source terminal is connected to the emitter of said first transistor in each of said first unit circuit elements, these emitters are connected together to form an output terminal, and the collector of said first transistor in each of said first unit circuit elements is connected to a second power-source terminal; and said second selection means has three second unit circuit elements each comprised of a second amplifier with an inverted input terminal and a non-inverted input terminal connected to said output terminal of said first selection means, and a second transistor having collector, base and emitter of conductivity types different from those of said first transistor, the base of said second transistor being connected to the output terminal of said second amplifier, and the emitter thereof being connected to the inverted input terminal of said second amplifier, and wherein a second constant-current circuit connected to said second power-source terminal is connected to the emitter of said second transistor in each of said second unit circuit elements, these emitters are connected together to form an output terminal, and the collector of said second transistor in each of said second unit circuit elements is connected to said first power-source terminal.

6. A signal selection circuit according to claim 5, wherein said first transistors are npn-type transistors, and said second transistors are pnp-type transistors.

7. A signal selection circuit according to claim 5, wherein said first transistors are pnp-type transistors, and said second transistors are npn-type transistors.

8. A signal selection circuit according to claim 5, wherein said frist and second constant-current circuits are current mirror-type constant-current circuits.

* * * * *